US009129780B2

(12) United States Patent
Azzazy et al.

(10) Patent No.: US 9,129,780 B2
(45) Date of Patent: Sep. 8, 2015

(54) STACKED MICRO-CHANNEL PLATE ASSEMBLY COMPRISING A MICRO-LENS

(75) Inventors: Medhat Azzazy, Laguna Niguel, CA (US); David Ludwig, Irvine, CA (US); James Justice, Newport Beach, CA (US)

(73) Assignee: PFG IP LLC, San Francisco, CA (US)

( * ) Notice: Subject to any disclaimer, the term of this patent is extended or adjusted under 35 U.S.C. 154(b) by 96 days.

(21) Appl. No.: 13/338,328

(22) Filed: Dec. 28, 2011

(65) Prior Publication Data

US 2012/0161010 A1 Jun. 28, 2012

Related U.S. Application Data

(63) Continuation-in-part of application No. 12/924,141, filed on Sep. 20, 2010, and a continuation-in-part of application No. 13/108,172, filed on May 16, 2011.

(60) Provisional application No. 61/277,360, filed on Sep. 22, 2009, provisional application No. 61/395,712, filed on May 18, 2010, provisional application No. 61/460,173, filed on Dec. 28, 2010, provisional application No. 61/460,172, filed on Dec. 28, 2010.

(51) Int. Cl.
*H01L 27/00* (2006.01)
*H01J 31/48* (2006.01)
*H01J 29/89* (2006.01)

(52) U.S. Cl.
CPC *H01J 31/48* (2013.01); *H01J 29/89* (2013.01)

(58) Field of Classification Search
CPC ........................ H01L 27/4636; H01L 27/4638
USPC ........... 250/353, 208.1, 336.1, 393, 372, 349; 356/139.04, 51, 326; 438/80
See application file for complete search history.

(56) References Cited

U.S. PATENT DOCUMENTS

| | | | | |
|---|---|---|---|---|
| 4,659,931 | A * | 4/1987 | Schmitz et al. | 250/338.4 |
| 5,198,657 | A * | 3/1993 | Trost et al. | 250/214 VT |
| 5,461,226 | A * | 10/1995 | Nicoli et al. | 250/214 VT |
| 6,885,004 | B2 * | 4/2005 | Taskar et al. | 250/367 |
| 7,570,354 | B1 * | 8/2009 | Zhao et al. | 356/237.2 |
| 7,956,988 | B1 * | 6/2011 | Moran | 356/5.04 |
| 2006/0081770 | A1 * | 4/2006 | Buchin | 250/214 VT |
| 2007/0002452 | A1 * | 1/2007 | Munro | 359/627 |
| 2007/0281288 | A1 * | 12/2007 | Belkin et al. | 435/4 |

* cited by examiner

*Primary Examiner* — Yara B Green
(74) *Attorney, Agent, or Firm* — Thomas M. Freiburger

(57) ABSTRACT

A multilayer electronic imaging module and sensor system incorporating a micro-lens layer for imaging and collimating a received image from a field of regard, a photocathode layer for detecting photons from the micro-lens layer and generating an electron output, a micro-channel plate layer for receiving the output electrons emitted from the photocathode in response to the photon input and amplifying same and stacked readout circuitry for processing the electron output of the micro-channel plate. The sensor system of the invention may be provided in the form of a Cassegrain telescope assembly and includes electromagnetic imaging and scanning means and beam-splitting means for directed predetermined ranges of the received image to one or more photo-detector elements which may be in the form of the micro-channel imaging module of the invention.

9 Claims, 2 Drawing Sheets

STACKED MICRO-CHANNEL PLATE ASSEMBLY COMPRISING A MICRO-LENS

CROSS-REFERENCE TO RELATED APPLICATIONS

This application is a continuation-in-part application of U.S. patent application Ser. No. 12/924,141 entitled “Multi-layer Photon Counting Electronic Module”, filed on Sep. 20, 2010, which in turn claims priority to U.S. Provisional Patent Application No. 61/277,360, entitled “Three-Dimensional Multi-Level Logic Cascade Counter” filed on Sep. 22, 2009, pursuant to 35 USC 119, which applications are incorporated fully herein by reference.

This application is a continuation-in-part application of U.S. patent application Ser. No. 13/108,172 entitled “Sensor Element and System Comprising Wide Field of View 3-D Imaging LIDAR”, filed on May 16, 2011, which in turn claims priority U.S. Provisional Patent Application No. 61/395,712, entitled “Autonomous Landing at Unprepared Sites for a Cargo Unmanned Air System” filed on May 18, 2010, pursuant to 35 USC 119, which applications are incorporated fully herein by reference.

This application further claims priority to U.S. Provisional Patent Application No. 61/460,173, filed on Dec. 28, 2010 and entitled “Micro-channel Plate Assembly for Use With an Electronic Imaging Device” and to U.S. Provisional Patent Application No. 61/460,172 filed on Dec. 28, 2010 entitled “Micro-channel Plate Assembly Comprising Micro-lens” pursuant to 35 USC 119, which applications are incorporated fully herein by reference.

STATEMENT REGARDING FEDERALLY SPONSORED RESEARCH AND DEVELOPMENT

Not applicable

1. FIELD OF THE INVENTION

The invention relates generally to the field of imaging technology.

More specifically, the invention relates to a multi-layer, micro-channel plate (MCP) electronic module comprising a collimating micro-lens structure for enhanced photo-detector performance in a small unit area and to a dual-imager sensor system comprising the module.

2. BACKGROUND OF THE INVENTION

Focal plane array technology incorporating very small pixel detector sizes (i.e., less than about five microns) poses significant technical challenges. Challenges include those related to the integration of readout integrated circuits (ROIC) for use in mega-pixel sized arrays. Small pixel sizes and large focal plane arrays are difficult to realize from both the electronic and detector sensitivity aspects.

Certain classes of focal plane array detectors and photon detectors desirably separate the photon-electron conversion process from the electronic readout circuitry in such a way as to enable very small circuit geometries. This technology can provide low-cost, high performance, mega-pixel imagers for applications in security and law enforcement and is applicable to military uses in reconnaissance, space, weapons sights, multi-purpose imaging, missile threat warning, chemical and biological detection and the like.

The major technical challenges in the field of focal plane array technology are detector size, readout integrated circuit electronics size, detector materials, detector sensitivity/quantum efficiency, electronics noise, speed and dynamic range; all of which are optimized by the electronic module disclosed herein.

The disclosed invention mitigates the conflict between pixel size and available electronics real estate within the pixel boundaries by partitioning electronics into multiple layers in a three-dimensional stack of integrated circuit chips.

SUMMARY OF THE INVENTION

The use of micro-channel plates in imager and focal plane array applications is increasing, owing in part to a micro-channel plate’s ability to provide relatively high gain with limited input but with concomitant technical challenges.

A primary technical challenge exists in that electrons emitted from output the individual micro-channels (referred to as “channels” or “pores” herein) tend to “spray out” of the bottom of the channels in a conic pattern in certain micro-channel assemblies, this characteristic is present to the level where stray electrons effectively bounce off of the top metal detector capacitor in the micro-channel plate assembly and then recollect at another location. The result of this deficiency is detector smearing or blooming, particularly when large input image signals are received.

A second deficiency in prior art micro-channel plate assemblies is that the gain occurs solely within the individual channels of the micro-channel plate. Some input electrons may bounce off of the micro-channel structure material surface between the individual channels and enter a different channel, resulting in poor image quality.

To overcome these and other deficiencies found in prior art micro-channel assemblies, Applicants disclose a micro-channel plate assembly comprising a one or multi-element micro-lens array that has the effect of optically and electrically “hiding” the inactive micro-channel plate surface material between the individual channels by collimating the received scene image and directing it into an associated channel.

The invention beneficially results in the redirection of input photons or electrons such that if a photon or electron would have been incident upon the inactive micro-channel plate surface material between individual channels, it is instead redirected or refocused immediately over, and thus received within, the channel input aperture.

The device of the invention is particularly well-suited for use with high F-number optical systems and to a lesser degree, with low F-number systems where light does not come into the micro-lens in parallel.

By utilizing micro-channel plate technology in a three-dimensional stack of microelectronic layers, linearity, low noise, mega-pixel sized arrays and wide dynamic range are obtained. The use of the above elements in the disclosed multi-layer electronic architecture enables a micro-channel plate detector assembly for image generation that is both inherently linear and uniform.

The invention herein takes advantage of stacked electronic circuitry such as pioneered by Irvine Sensors Corporation, assignee of the instant application, and comprises a stacked micro-lens array, a photocathode element, and a micro-channel plate with associated readout circuitry to save space and increase performance.

In a first aspect of the invention, an electronic micro-channel module comprising a stack of layers is provided wherein the layers comprise a micro-lens array layer comprising at least one micro-lens element, a photocathode layer for generating a photocathode electron output in response to a predetermined range of the electromagnetic spectrum, a micro-channel plate layer comprising at least one channel for generating a cascaded electron output in response to the photocathode electron output and a readout circuit layer for processing the output of the channel.

In a second aspect of the invention, the readout circuit layer comprises a first sub-layer and a second sub-layer that are electrically coupled by means of at least one through-silicon via.

In a third aspect of the invention, the electronic module further comprises a thermoelectric cooling layer for stabilizing the temperature of the module.

In a fourth aspect of the invention, the beam output of the micro-lens element is substantially collimated.

In a fifth aspect of the invention, the module is disposed in a vacuum environment or package.

In a sixth aspect of the invention, the module is provided as a pin grid array package.

In a seventh aspect of the invention, the readout circuit layer is comprised of a set of readout sub-layers comprising a capacitor top metal and analog preamp sub-layer, a filtering and comparator sub-layer and a digital processing sub-layer.

In an eighth aspect of the invention, the predetermined range of the electromagnetic spectrum comprises a range selected from the ultraviolet, visible, near-infrared, short-wave infrared, medium-wave infrared, long-wave infrared, far-infrared and x-ray ranges of the electromagnetic spectrum.

In a ninth aspect of the invention, the micro-channel plate is comprised of at least one micro-channel having a diameter of less than about 10 microns.

In a tenth aspect of the invention, the micro-channel plate is comprised of at least one micro-channel having a diameter of less than about 5 microns.

While the claimed apparatus and method herein has or will be described for the sake of grammatical fluidity with functional explanations, it is to be understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112, are to be accorded full statutory equivalents under 35 USC 112.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE INVENTION

Turning to the figures wherein like numerals define like elements among the several views, a multi-layer micro-channel plate assembly and module comprising a micro-lens layer structure for use in an imaging system is disclosed.

Using the micro-channel plate assembly and module of the invention, a relatively small photon arrival event will result in a large number of output electrons (i.e., a cloud of electrons) and provide increased photo-detector performance.

Figure 1:
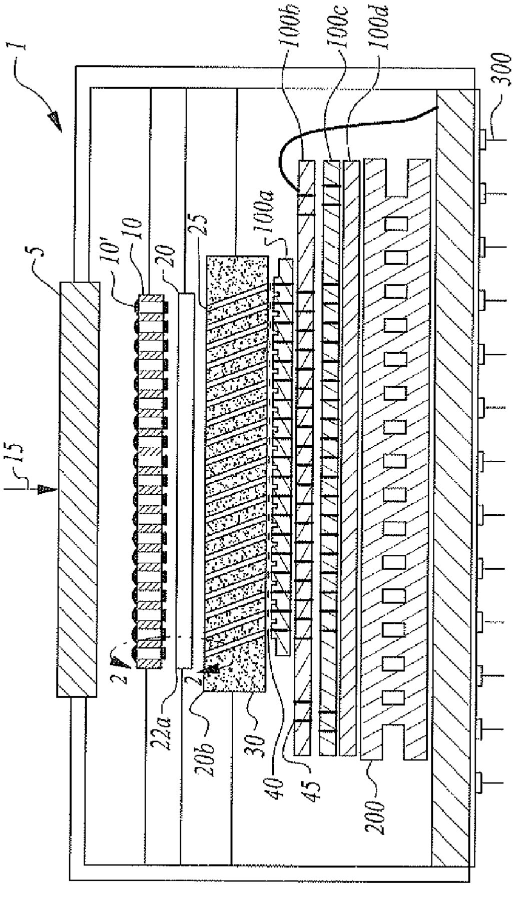
FIG. 1 depicts a preferred embodiment of the stacked, multi-layer electronic module of the invention.

Turning now to a preferred embodiment of the micro-channel plate module 1 of the invention shown in FIG. 1, micro-channel plate technology and readout integrated circuit ("ROIC") technology are integrated into a three-dimensional, stacked plurality of microelectronic layers in the form of a stacked electronic module to provide a high-circuit density structure for use in imaging applications.

Module 1 comprises a stack of microelectronic integrated circuit layers, each layer of which may comprise a plurality of sub-layers.

A window element 5 is provided in the preferred vacuum package enclosure encasing module 1 for the receiving of electromagnetic radiation (i.e., reflected or emitted light or electromagnetic energy) from a scene of interest. Window element 5 may be comprised of a fused silica or sapphire material suitable for transmitting a predetermined received wavelength selected by the user.

Incident electromagnetic radiation from the scene of interest is received through window 5 by the micro-lens array layer 10.

In the illustrated embodiment, micro-lens array 10 comprises a plurality of individual lens elements 10'.

Figure 2:
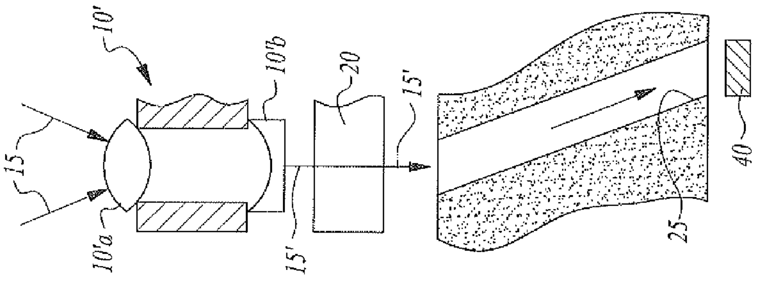
FIG. 2 is taken along 2-2 of FIG. 1 and depicts a two-element collimating micro-lens with an output directed upon the input surface of a photocathode layer and the output of the photocathode layer being directed to and received by and within the input aperture of an individual channel of a micro-channel plate.

Individual lens elements 10' may further each comprise a plurality of lens sub-elements such as a biconvex lens sub-element 10'*a* in optical cooperation with a plano-concave lens sub-element 10'*b* depicted in FIG. 2. Individual lens elements 10' of micro-lens array 10 receive incident radiation 15 from the scene and collect and collimate it to provide a focused and collimated micro-lens array output beam 15'.

Micro-lens array 10 may comprise a two-dimensional array of individual lens elements 10' wherein each lens element has a diameter of about 0.05 to about 3 mm and a focal length of about 0.2 or 20 mm or may be provided to have a tunable focal length.

A photocathode layer 20 is provided and has an input surface 20*a* and an output surface 20*b*. Photocathode layer 20 produces an electron output in response to an input of a predetermined range of the electromagnetic spectrum received from the lens element 10'. In a preferred embodiment, the photocathode layer 20 comprises an indium gallium arsenide material or InGaAs and is responsive to electromagnetic radiation in the infrared spectrum or IR.

The collimated micro-lens beam output 15' is incident upon the input surface 20*a* of photocathode layer 20 and produces an electron output in response thereto. Because the photon input to photocathode layer 20 is substantially collimated by the plurality of multiple lens elements 10' of micro-lens array layer 10, the electron output of photocathode layer 20 is substantially focused and defined so as to be received within individual channels 25 of micro-channel plate assembly layer 30 rather than striking the inactive area of the micro-channel plate surface.

The diameter of the individual lens elements 10' is preferably greater than that of the diameter of channels 25 in micro-channel plate 30 in order to capture and redirect incident radiation from the scene that would ordinarily strike the inactive micro-channel plate array surface and instead is directed into the individual channels.

Photocathode layer 20 serves to convert input photons of a predetermined frequency or wavelength from a scene of interest into output electrons which exit the photocathode and are received by channels 25 disposed through the thickness of micro-channel plate 30.

Photocathode 20 comprises a charged electrode that when struck by one or more photons, emits one or more electrons due to the photoelectric effect, generating an electrical current flow through it.

The channels 25 are disposed in the micro-channel plate structure material such that they are substantially parallel to each other and in preferred embodiments, are defined at a predetermined angle relative to the micro-channel input surface and micro-channel output surface of micro-channel plate 30.

As is known in the field of micro-channel plate technology, channels 25 function as electron multipliers acting as pixels when under the presence of an electric field. In operation, an electron emitted from photocathode layer 20 is admitted to the input aperture of channel 25 of micro-channel plate layer 30. The orientation of channel 25 assures the electron will strike the interior wall or walls of channel 25 because of the angle at which the channels 25 are disposed with respect to planar surface of the micro-channel plate layer 30 itself.

In operation, the collision of an electron with the interior walls of channel 25 causes an electron "cascading" effect, resulting in the propagation of a plurality of electrons through the channel and toward micro-channel layer output aperture.

The cascade of electrons exits the micro-channel layer output as an electron "cloud" whereby the electron input signal is amplified (i.e., cascaded) by several orders of magnitude to generate an amplified electron output signal.

Design factors affecting the amplification of the electron output signal from micro-channel plate 30 include electric field strength, the geometry of channels 25 and the micro-channel plate device material.

Subsequent to the electron output signal exiting a channel 25, the micro-channel plate 30 recharges during a refresh cycle before another electron input signal is detected as is known in the field of micro-channel plate technology.

The amplified electron output signal from channel 25 comprising a cascaded plurality of electrons is received by an electrically conductive member 40 that is electronically coupled with appropriate readout circuitry.

The electronic coupling of sub-layers in the readout circuitry layer may be such as by electrically conductive through-silicon vias 45 disposed within or between the sub-layers.

The photocathode layer 20 output surface is disposed proximal and coplanar with micro-channel layer 30 input surface whereby when a photon strikes photocathode layer 20 input surface, one or more electrons are emitted thereby and enter a channel 25 disposed through the micro-channel plate, generating an electron cascade effect and defining a photon arrival event. The electrons generated by the photon arrival event are processed by elements of the stacked assembly and the micro-channel plate output is processed using suitable circuitry whereby an image is produced.

The photocathode and micro-channel plate of the invention are available from Hamamatsu or Photonis (Burle) and are preferably integrated as a stack of layers with the ROIC. In one embodiment, the micro-channel plate may be optimized using atomic layer deposition (ALD) films for conductive, secondary electron emission, photocathode and stabilization layers to simplify integration.

The three-dimensional stacked microelectronic architecture of the invention permits considerably lower detector size in part due to the use of small circuits and through-silicon-via (TSV) technology to electrically couple the layers of the invention while maintaining high frame rates and five micron pixel sizes.

Figure 3:
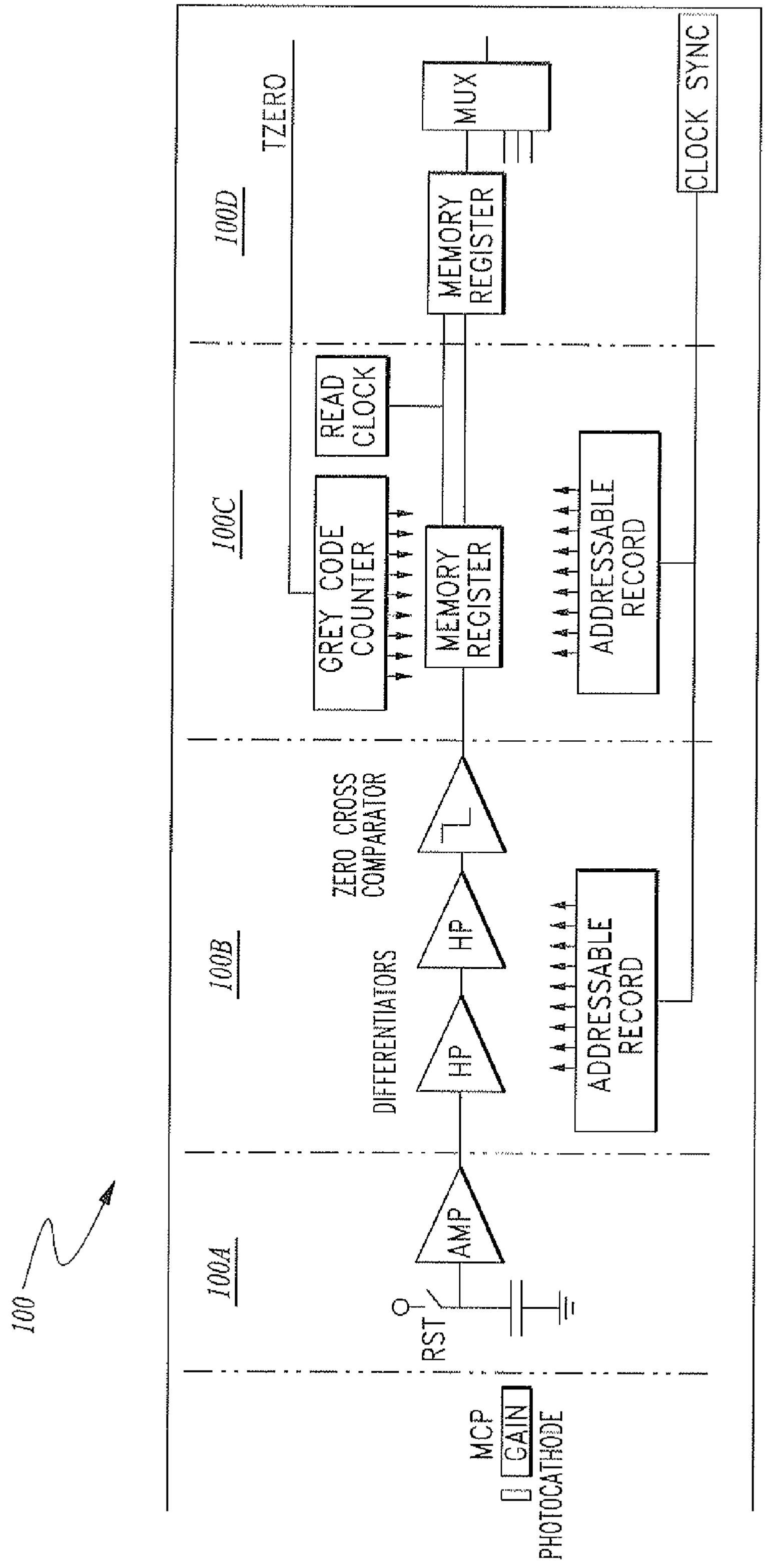
FIG. 3 depicts a sensor system in a Cassegrain reflector telescope configuration and comprising the stacked, multi-layer electronic module of the invention.

The invention may comprise a plurality of stacked and interconnected sub-layers in the form of integrated circuit chips that define a readout circuit layer 100. In the illustrated embodiment, readout circuit layer 100 comprises a plurality of sub-layers, here illustrated in FIGS. 1 and 3 as sub-layers 100A-D.

Sub-layer 100A may comprise preamplifier circuitry for noise reduction, improved signal-to-noise ratio, preprocessing and conditioning the output of the micro-channel layer 30 and may comprise a capacitor top metal and analog preamp circuitry.

Sub-layer 100B may comprise one or more differentiator circuits having an output received by a zero-crossing comparator with an addressable record input and may comprise filtering and comparator circuitry.

Sub-layers 100C and 100D comprise digital processing circuitry.

Sub-layer 100C may comprise a resettable Gray Code counter with an input into a first memory register.

Sub-layer 100D may comprise a second memory register and multiplexing circuitry for multiplexing the output of the module to external circuitry.

The sub-layers 100A-D may be electrically coupled using through-silicon via 45 technology, wire-bonding, side-bussing using metallized T-connect structures or equivalent electrical coupling means used to electrically couple stacked microelectronic layers.

A thermoelectric cooler layer 200 may be provided in the module for temperature stabilization.

The module may further be provided in the form of a pin grid array package interface 300 for electrical connection to external circuitry such as using a socketed connection.

Figure 4:
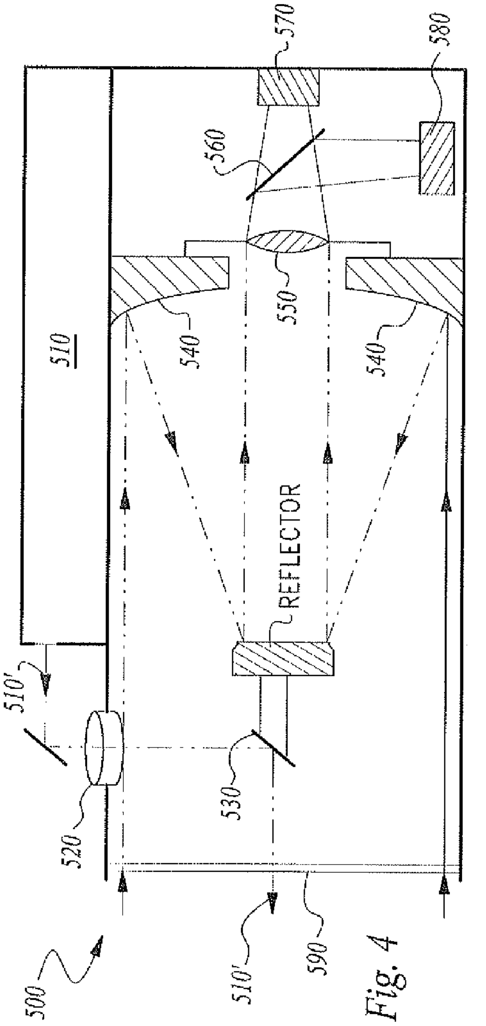
FIG. 4 depicts an electronic circuit block diagram of a preferred embodiment of the stacked microelectronic layers as a set of LIDAR readout integrated circuit chips of the invention.

Turning to FIG. 4, a sensor system 500 incorporating the micro-channel module 1 of the invention is disclosed.

Sensor system 500 may comprise imaging means 510 for providing an electromagnetic illumination beam 510' having a predetermined wavelength such as an eye-safe, four millijoule laser source pulsed at 30 Hz with seven nanosecond pulse widths operating in about the 1.5 to about 2.0 micron region.

Sensor system 500 may further comprise holographic beam-forming optics 520 and beam-scanning means 530 which may be in the form of a tip-tilt mirror assembly for scanning the illumination beam on a target in a field of regard.

Sensor system 500 may comprise a parabolic reflector element 540 in optical cooperation with a hyperbolic reflector element 550.

The sensor system 500 may comprise beam-splitting optical means 560 for the division of the received optical beam input into a first and second predetermined range of the electromagnetic spectrum.

The sensor system of the invention may comprise a first photo-detector element 570 responsive to a predetermined first range of the electromagnetic spectrum and a second photo-detector element 580 responsive to a predetermined second range of the electromagnetic spectrum. The first and second photo-detector elements 570 and 580 may each be selected to be responsive to predetermined ranges of the electromagnetic spectrum selected from the ultraviolet, visible, near-infrared, short-wave infrared, medium-wave infrared, long-wave infrared, far-infrared and x-ray ranges of the electromagnetic spectrum.

At least one of the first and second photo-detector elements may comprise a module 1 of the invention.

The parabolic reflector element 540 and the hyperbolic reflector element 550 are preferably configured as a Cassegrain reflector telescope assembly.

The illumination beam is projected through and incoming electromagnetic radiation is received through a common aperture 590.

One or more optical notch or band-pass filters may optionally be provided between the beam-splitter and the first or second photo-detector elements or both to narrow the range of electromagnetic frequencies received by them from the split input beam.

The first and second photo-detector elements 570 and 580 may be provided in sensor system 500 wherein at least one of the first and second photo-detector elements 570 and 580 comprises electronic module 1 comprising a stack of layers wherein the layers comprise a micro-lens array layer 10, a photocathode layer 20 for generating a photocathode electron output in response to a predetermined range of the electromagnetic spectrum, a micro-channel plate layer 30 comprising at least one channel 25 for generating a cascaded electron output in response to the photocathode electron output and a readout circuit layer 10 for processing the output of the micro-channel layer.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a sub-combination or variation of a sub-combination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptually equivalent, what can be obviously substituted and also what essentially incorporates the essential idea of the invention.

We claim:

1. An electronic module comprising a stack of layers wherein the layers comprise:

a micro-lens array layer comprising at least one individual lens element for providing a beam output, a photocathode layer for generating a photocathode electron output in response to a predetermined range of the electromagnetic spectrum, a micro-channel plate layer comprising at least one micro-channel for generating a cascaded electron output in response to the photocathode electron output, and, a readout circuit layer for processing the output of the micro-channel, the readout circuit layer comprised of a set of readout sub-layers comprising a capacitor top metal and analog preamp sub-layer, a filtering and comparator sub-layer and a digital processing sub-layer.

2. The electronic module of claim 1 wherein the readout circuit layer comprises a first sub-layer and a second sub-layer that are electrically coupled by means of at least one through-silicon via.

3. The electronic module of claim 1 further comprising a thermoelectric cooling layer.

4. The electronic module of claim 1 wherein the beam output of the lens element is collimated.

5. The electronic module of claim 1 wherein the module is disposed in a vacuum environment.

6. The electronic module of claim 1 wherein the module is provided as a pin grid array package.

7. The electronic module of claim 1 wherein the predetermined range of the electromagnetic spectrum comprises a range selected from the ultraviolet, visible, near-infrared, short-wave infrared, medium-wave infrared, long-wave infrared, far-infrared and x-ray ranges of the electromagnetic spectrum.

8. The electronic module of claim 1 wherein the micro-channel plate is comprised of at least one micro-channel having a diameter of less than about 10 microns.

9. The electronic module of claim 1 wherein the micro-channel plate is comprised of at least one micro-channel having a diameter of less than about 5 microns.

* * * * *